United States Patent
Wan et al.

(10) Patent No.: US 8,815,712 B2
(45) Date of Patent: Aug. 26, 2014

(54) METHOD FOR EPITAXIAL RE-GROWTH OF SEMICONDUCTOR REGION

(75) Inventors: Cheng-Tien Wan, Tainan (TW); You-Ru Lin, New Taipei (TW); Yi-Jing Lee, Hsin-Chu (TW); Cheng-Hsien Wu, Hsin-Chu (TW); Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 159 days.

(21) Appl. No.: 13/414,357

(22) Filed: Mar. 7, 2012

(65) Prior Publication Data

US 2013/0171792 A1 Jul. 4, 2013

Related U.S. Application Data

(60) Provisional application No. 61/580,939, filed on Dec. 28, 2011.

(51) Int. Cl.
*H01L 21/36* (2006.01)
*H01L 21/20* (2006.01)

(52) U.S. Cl.
USPC .......... 438/478; 438/492; 438/503; 438/504; 438/710; 438/714; 257/288; 257/344; 257/408; 257/E21.09; 257/E21.092; 257/E21.097; 257/E21.103; 257/E21.132

(58) Field of Classification Search
None
See application file for complete search history.

(56) References Cited

U.S. PATENT DOCUMENTS

| | | | | |
|---|---|---|---|---|
| 6,642,151 | B2 * | 11/2003 | Khan et al. | 438/714 |
| 6,979,631 | B2 * | 12/2005 | Gonzalez et al. | 438/479 |
| 7,344,951 | B2 * | 3/2008 | Smith et al. | 438/300 |
| 7,410,859 | B1 * | 8/2008 | Peidous et al. | 438/231 |
| 7,626,246 | B2 * | 12/2009 | Lochtefeld et al. | 257/647 |
| 7,670,934 | B1 * | 3/2010 | Pal et al. | 438/481 |
| 7,696,534 | B2 * | 4/2010 | Peidous et al. | 257/190 |
| 7,902,008 | B2 * | 3/2011 | Peidous et al. | 438/166 |
| 8,076,209 | B2 * | 12/2011 | Yang et al. | 438/299 |
| 8,124,473 | B2 * | 2/2012 | Pan et al. | 438/233 |
| 8,148,214 | B2 * | 4/2012 | Waite et al. | 438/150 |
| 8,159,030 | B2 * | 4/2012 | Waite et al. | 257/347 |
| 8,253,204 | B2 * | 8/2012 | Lee et al. | 257/368 |
| 8,372,755 | B2 * | 2/2013 | Wang et al. | 438/717 |
| 2007/0218707 | A1 | 9/2007 | Sadaka et al. | |
| 2008/0197412 | A1 | 8/2008 | Zhang et al. | |

FOREIGN PATENT DOCUMENTS

KR 1020080102388 11/2008
KR 1020090118935 11/2009

* cited by examiner

*Primary Examiner* — Zandra Smith
*Assistant Examiner* — Khanh Duong
(74) *Attorney, Agent, or Firm* — Slater & Matsil, L.L.P.

(57) ABSTRACT

A treatment is performed on a surface of a first semiconductor region, wherein the treatment is performed using process gases including an oxygen-containing gas and an etching gas for etching the semiconductor material. An epitaxy is performed to grow a second semiconductor region on the surface of the first semiconductor region.

20 Claims, 8 Drawing Sheets

METHOD FOR EPITAXIAL RE-GROWTH OF SEMICONDUCTOR REGION

This application claims the benefit of the following provisionally filed U.S. Patent Application Ser. No. 61/580,939, filed Dec. 28, 2011, and entitled "Pre-Clean for SiGe Epitaxy in a CMOS Process and Resulting Structures," which application is hereby incorporated herein by reference.

BACKGROUND

The speed of Metal-Oxide-Semiconductor (MOS) transistors is closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Germanium is a commonly known semiconductor material. The electron mobility and hole mobility of germanium are greater than that of silicon, which is the most commonly used semiconductor material in the formation of integrated circuits. Hence, germanium is an excellent material for forming integrated circuits. In the past, however, silicon gained more popularity since its oxide (silicon oxide) is readily usable in the gate dielectrics of MOS transistors. The gate dielectrics of the MOS transistors can be conveniently formed by thermally oxidizing silicon substrates. The oxide of germanium, on the other hand, is soluble in water, and hence is not suitable for the formation of gate dielectrics.

With the use of high-k dielectric materials in the gate dielectrics of the MOS transistors, however, the convenience provided by the silicon oxide is no longer a big advantage, and hence germanium is reexamined for use in the formation of MOS transistors.

Semiconductor re-growth was explored to improve the quality of silicon germanium or germanium films. One of the semiconductor re-growth processes comprises blanket depositing a dislocation-blocking mask on a semiconductor substrate, and forming an opening in the dislocation-blocking mask until the semiconductor substrate is exposed through the opening. A re-growth is then performed to form a re-growth region in the opening, which growth region is formed of a semiconductor material such as germanium or silicon germanium. Although the quality of the re-growth region is generally improved over the blanket-formed films formed of the same material as the re-growth region, defects such as dislocations were still observed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A method of re-growing semiconductor regions is provided in accordance with various exemplary embodiments. The intermediate stages of performing the re-growth in accordance with some embodiments are illustrated. The variations of the embodiments are discussed. Throughout the various views and illustrative embodiments, like reference numbers are used to designate like elements.

Figure 1:
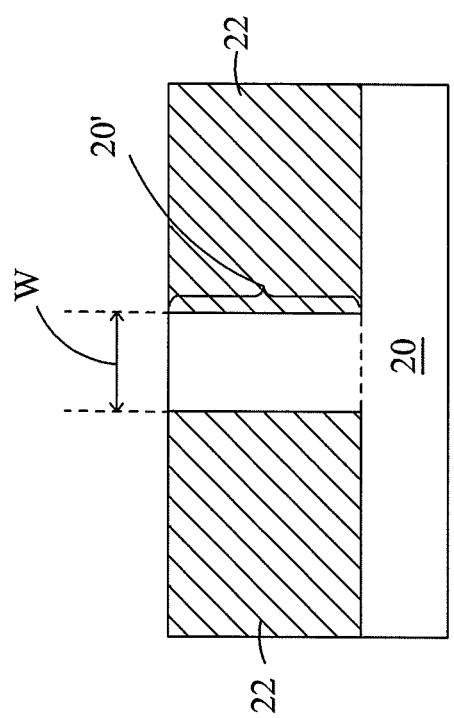
FIGS. 1 through 5 are cross-sectional views of intermediate stages in the manufacturing of a semiconductor fin and a Fin Field-Effect Transistor (FinFET) in accordance with some exemplary embodiments.

Referring to FIG. 1, substrate 20 is provided. Substrate 20 may be a semiconductor substrate, and may further be a silicon substrate. Insulation regions such as Shallow Trench Isolation (STI) regions 22 are formed in substrate 20. STI regions 22 may be formed by recessing semiconductor substrate 20 to form openings, and then filling the openings with dielectric materials. A Chemical Mechanical Polish (CMP) is then performed to remove excess portions of the dielectric materials, and the remaining portions are STI regions 22.

STI regions 22 include two neighboring regions with their sidewalls facing each other. The two neighboring regions may be separate regions, or may be portions of a continuous region, which may form a STI ring in some embodiments. Portion 20' of substrate 20 is between, and adjoins, the two neighboring STI regions 22. Width W of substrate portion 20' may be small. In some exemplary embodiments, width W is less than about 50 nm. It is appreciated that the dimensions recited throughout the description are merely examples, and may be changed to different values.

Figure 2:
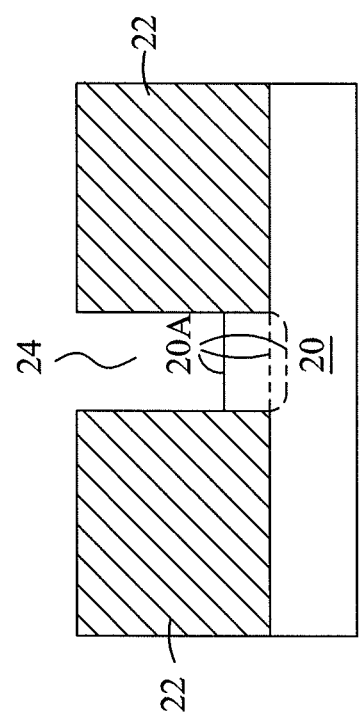

Referring to FIG. 2, at least an upper portion of substrate portion 20' is removed, forming recess 24. In some embodiments, the bottom of recess 24 is higher than the bottom surfaces of STI regions 22. In alternative embodiments, the bottom of recess 24 (as shown by dotted lines) may be substantially level with or lower than the bottoms of STI regions 22.

Figure 3:
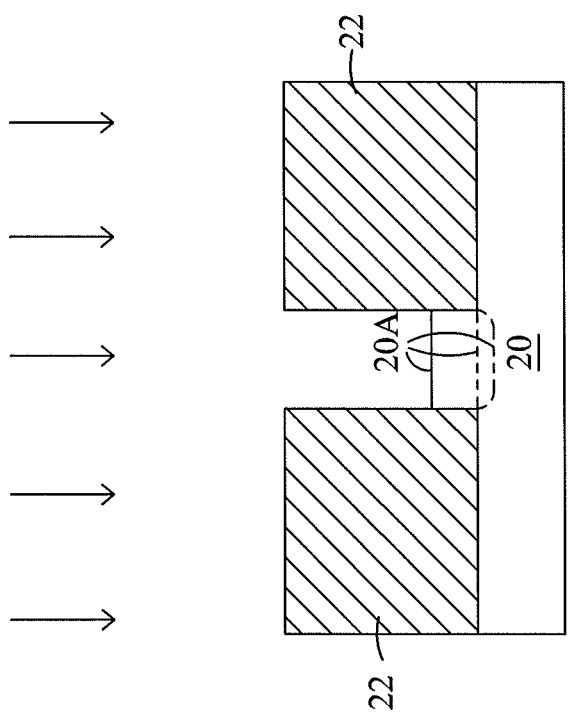

Referring to FIG. 3, a surface treatment is performed to treat the exposed surface 20A of substrate 20, wherein surface 20A is inside recess 24. The surface treatment may be performed in a chamber (not shown) capable of having a vacuumed environment. The process gases of the treatment include an oxygen-containing gas and an etching gas, which may be used simultaneously. The etching gas has the function of etching substrate 20. In some embodiments, the oxygen-containing gas includes oxygen ($O_2$), ozone ($O_3$), or combinations thereof. The etching gas may include a fluorine-containing gas such as $CF_4$. In alternative embodiments, the etching gas includes a chlorine-containing gas such as HCl. During the treatment, a flow rate ratio, which is the ratio of the flow rate of the oxygen-containing gas to a total flow rate of the oxygen-containing gas and the etching gas, may be greater than about 0.01. The flow rate ratio may also be between about 0.01 and about 0.9999, between about 1 percent and about 99 percent, or between about 0.99 and about 0.995. The total pressure of the oxygen-containing gas and the etching gas may be between about 1 mTorr and about 750 Torr. In some exemplary embodiments, the treatment includes a plasma treatment, wherein the respective Radio Frequency (RF) power may be between about 1,100 Watts and about 1,500 Watts. During the treatment, substrate 20 may be heated to a temperature between about 150° and about 300° C. The duration of the treatment may be between about 10 seconds and about 30 minutes.

Due to the treatment, surface 20A of substrate 20 is improved. The pits and islands that are formed on surface 20A are reduced, wherein the pits and islands are recessed portions and protruding portions of substrate 20, and are caused by the recessing of substrate 20. Surface 20A is thus smoother. With smoother surface 20A, the subsequently re-grown semiconductor region 26 (not shown in FIG. 3, please refer to FIG. 4) has better quality.

After the surface treatment, a cleaning may be performed on substrate 20, including surface 20A. The cleaning may be used to remove the native oxide, if any, that is formed on surface 20A. In some embodiments, the cleaning is performed using the diluted HF solution.

Figure 4:
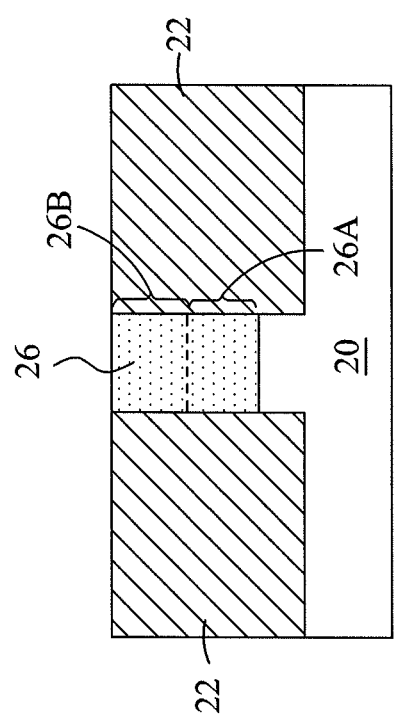
Figure 5:
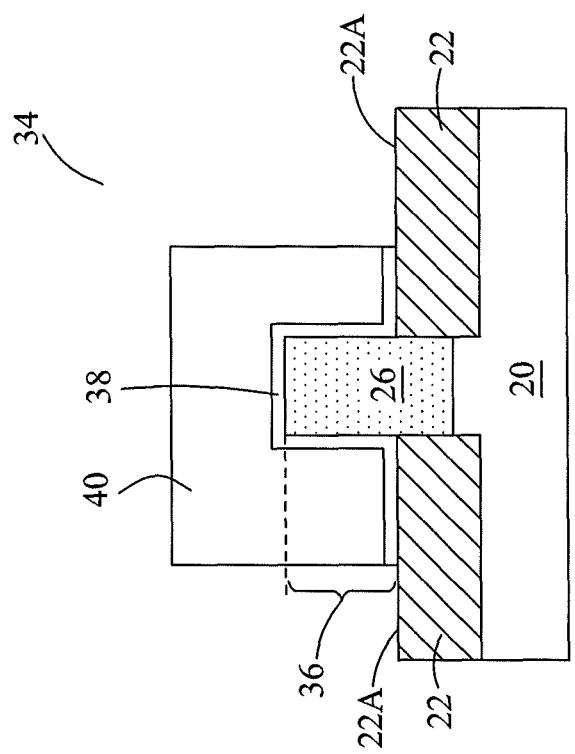

Next, referring to FIG. 4, semiconductor region 26 is grown in recess 24 through epitaxy. In some embodiments, semiconductor region 26 comprises germanium, and may include silicon germanium in some exemplary embodiments. The silicon germanium may be expressed as $Si_{1-x}Ge_x$, wherein x is the atomic percentage of germanium, and may be in the range greater than 0, and equal to or less than 1. In some embodiments, semiconductor region 26 comprises substantially pure germanium (with x equal to 1). In alternative embodiments, semiconductor region 26 may include other semiconductor materials such as silicon carbon, substantially pure silicon, III-V compound semiconductor materials such as GaN, AlAs, GaN, InN, AlN, $In_xGa_{(1-x)}N$, $Al_xGa_{(1-x)}N$, $Al_xIn_{(1-x)}N$, $Al_xIn_yGa_{(1-x-y)}N$, and combinations thereof, wherein each of x and y may be greater than 0 and less than 1.

In some embodiments, semiconductor region 26 includes lower portion 26A and upper portion 26B having different compositions. For example, lower portion 26A and upper portion 26B may have different germanium percentages, wherein upper portion 26B may have a higher germanium percentage than lower portion 26A. This structure may be used for forming a p-type Fin Field-Effect Transistor (FinFET). Alternatively, upper portion 26B may have a lower germanium percentage than lower portion 26A. This structure may be used for forming an n-type FinFET.

Semiconductor region 26 may be grown to a level higher than the top surfaces of STI regions 22. A Chemical Mechanical Polish (CMP) may be performed to level the top surface of STI regions 22 and semiconductor region 26. In alternative embodiments, the growth of semiconductor region 26 stops at a time when the top surface of semiconductor region 26 is level with or lower than the top surfaces of STI regions 22. In these embodiments, no CMP is performed.

In subsequent processes, FinFET 34 is formed. The formation process may include recessing STI regions 22, so that the resulting top surfaces 22A of STI regions 22 are lower than the top surface of semiconductor region 26. The portion of semiconductor region 26 higher than top surfaces 22A forms semiconductor fin 36. Next, gate dielectric 38 is formed on the sidewalls and the top surface of semiconductor fin 36. Gate electrode 40 is formed on gate dielectric 38. Source and drain regions (not shown) are also formed.

Figure 6:
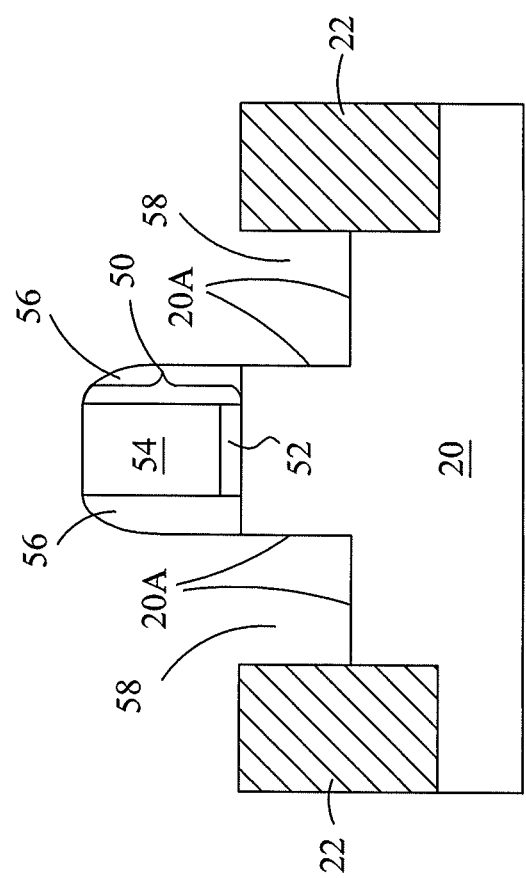
FIGS. 6 through 8 are cross-sectional views of intermediate stages in the manufacturing of a planar transistor in accordance with some exemplary embodiments.
Figure 7:
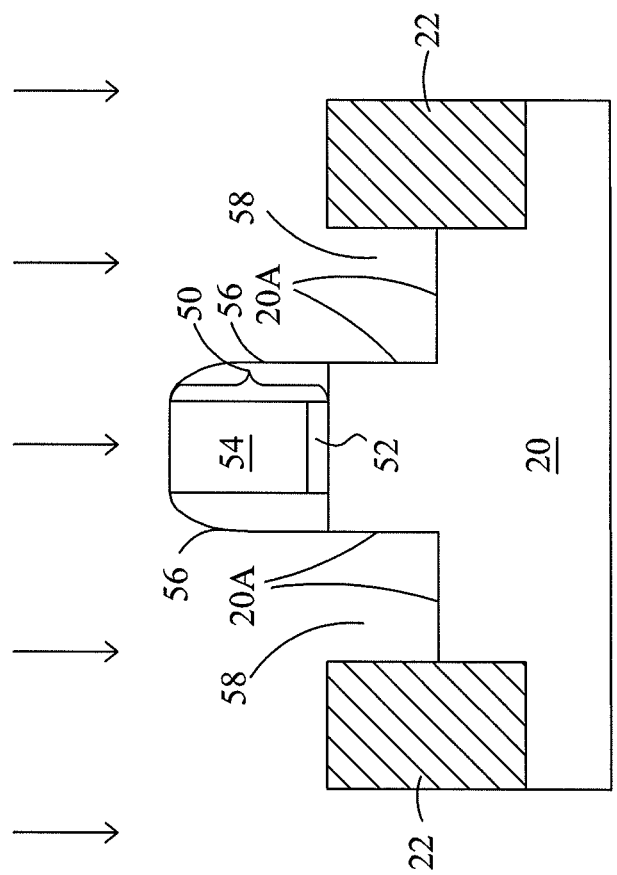
Figure 8:
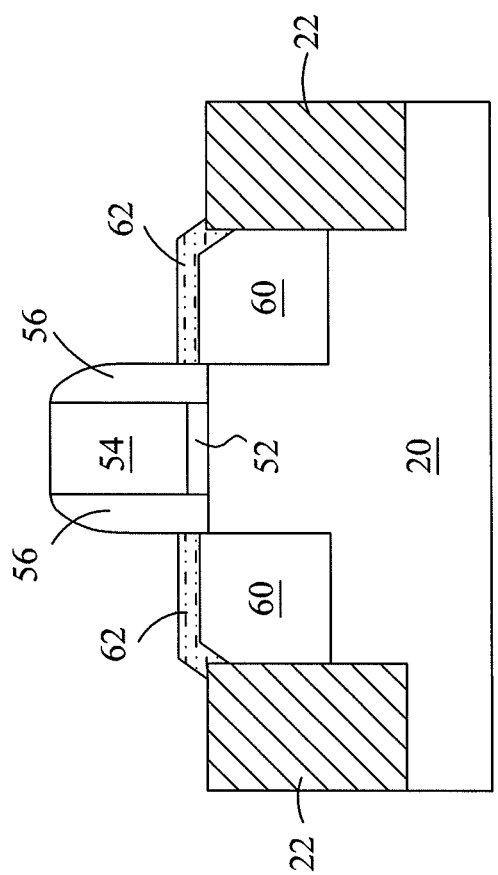

FIGS. 6 through 8 illustrate cross-sectional views of intermediate stages in the formation of a planar Metal-Oxide-Semiconductor (MOS) transistor in accordance with alternative embodiments. Unless specified otherwise, the materials and the formation methods of the components in these embodiments are essentially the same as the like components, which are denoted by like reference numerals in the embodiments shown in FIGS. 1 through 5. The details of the like components shown in FIGS. 6 through 8 may thus be found in the discussion of the embodiments shown in FIGS. 1 through 5.

Referring to FIG. 6, gate stack 50 is formed over substrate 20. Gate stack 50 includes gate dielectric 52, which may include silicon oxide or a high-k dielectric material having a k value higher than 3.9. Gate electrode 54 may comprise polysilicon, metals, metal silicides, and/or the like. Gate spacers 56 are formed on the sidewalls of gate stack 50.

Recesses 58 are formed in substrate 20 by etching substrate 20. The recessing may include isotropic and/or anisotropic etching, wherein gate spacers 56 act as an etching mask. After the etching, surfaces 20A of substrate 20 are exposed, wherein surfaces 20A are located in recesses 58. Next, as shown in FIG. 7, a treatment is performed to treat surfaces 20A. The details of the treatment may be essentially the same as the treatment step in FIG. 3. For example, the treatment may be performed using an oxygen-containing gas and an etching gas. After the treatment, a cleaning may be performed, for example, using diluted HF solution, so that the native oxides, if any, on the exposed surfaces 20A of substrate 20 may be removed.

Next, as shown in FIG. 8, semiconductor regions 60 are grown in recesses 58 through an epitaxy. Semiconductor regions 60 may be silicon regions (with no germanium and/or carbon added), silicon germanium regions, silicon carbon regions, or the like, although other semiconductor materials may also be formed. Semiconductor regions 60 may act as stressors for applying a compressive stress or a tensile stress to a channel of the respective MOS transistor. Semiconductor regions 60 may also act as the source/drain regions of the MOS transistor. Next, a silicidation is performed to form silicide regions 62 over semiconductor regions 60.

In the embodiments, by treating the surfaces of a semiconductor material before growing semiconductor regions, the treated surface of the semiconductor material is smoother, and the quality of the grown semiconductor regions is significantly improved.

In accordance with embodiments, a treatment is performed on a surface of a first semiconductor region, wherein the treatment is performed using process gases including an oxygen-containing gas and an etching gas for etching the semiconductor material. An epitaxy is performed to grow a second semiconductor region on the surface of the first semiconductor region.

In accordance with other embodiments, a method includes etching a semiconductor substrate to form a recess. The semiconductor substrate thus includes a top surface in the recess. A treatment is performed on the top surface, wherein the treatment is performed using process gases including an oxygen-containing gas and an etching gas capable of etching the semiconductor substrate. After the treatment, a cleaning is performed on the top surface. After the treatment, an epitaxy is performed to grow a semiconductor region in the recess.

In accordance with yet other embodiments, a method includes forming STI regions extending from a top surface of a silicon substrate into the silicon substrate, and etching a portion of the silicon substrate between opposite sidewalls of the STI regions to form a recess. The silicon substrate includes a top surface in the recess. The method further includes performing a treatment on the top surface, wherein the treatment is performed using process gases comprising $CF_4$ and $O_2$. After the treatment, a cleaning is performed on the top surface of the silicon substrate. An epitaxy is then performed to grow a germanium-containing semiconductor region in the recess. The germanium-containing semiconductor region is grown from the top surface in the recess.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming Shallow Trench Isolation (STI) regions extending from a top surface of a semiconductor substrate into the semiconductor substrate;
   etching a portion of the semiconductor substrate between opposite sidewalls of the STI regions to form a recess;
   performing a treatment on a surface of the semiconductor substrate, with the surface being in the recess, wherein the treatment is performed using process gases comprising:
      an oxygen-containing gas; and
      an etching gas capable of etching the semiconductor substrate;
   performing an epitaxy to grow a second semiconductor region starting from the surface; and
   after the performing the epitaxy, recessing the STI regions.

2. The method of claim 1, wherein the oxygen-containing gas is selected from the group consisting essentially of oxygen ($O_2$), ozone ($O_3$), and combinations thereof.

3. The method of claim 1, wherein the oxygen-containing gas comprises $O_2$.

4. The method of claim 1 further comprising, before the performing the epitaxy and after the treatment, performing a cleaning on the surface.

5. The method of claim 1, wherein the treatment comprises a plasma treatment.

6. The method of claim 1, wherein the performing the epitaxy to grow the second semiconductor region comprises growing a III-V compound semiconductor material.

7. The method of claim 1, wherein the etching gas comprises $CF_4$.

8. The method of claim 1, wherein a top portion of the second semiconductor region over the recessed STI regions forms a fin;
   forming a gate dielectric on sidewalls and a top surface of the fin; and
   forming a gate electrode over the gate dielectric.

9. A method comprising:
   forming Shallow Trench Isolation (STI) regions extending from a top surface of a semiconductor substrate into the semiconductor substrate;
   etching a portion of the semiconductor substrate between opposite sidewalls of the STI regions to form a recess, wherein the portion of the semiconductor substrate comprises a top surface in the recess;
   performing a treatment on the top surface, wherein the treatment is performed using process gases comprising:
      an oxygen-containing gas; and
      an etching gas capable of etching the semiconductor substrate;
   after the treatment, performing a cleaning on the top surface; and
   after the treatment, performing an epitaxy to grow a semiconductor region in the recess;
   after the epitaxy, recessing the STI regions.

10. The method of claim 9 further comprising:
    before the step of etching the semiconductor substrate, forming a gate stack of a transistor over the semiconductor substrate; and
    forming spacers on opposite sidewalls of the gate stack, wherein the step of etching is performed using the spacers as an etching mask, and wherein the semiconductor region forms a source/drain stressor region of the transistor.

11. The method of claim 9, wherein the oxygen-containing gas comprises oxygen ($O_2$), and wherein the etching gas comprises $CF_4$.

12. The method of claim 11, wherein the cleaning is performed using a solution comprising diluted HF.

13. The method of claim 12, wherein a flow-rate ratio of a flow rate of $O_2$ to a total flow rate of $CF_4$ and $O_2$ is greater than about 1 percent.

14. The method of claim 11, wherein the treatment comprises a plasma treatment.

15. The method of claim 9, wherein the performing the epitaxy to grow the semiconductor region comprises growing a III-V compound semiconductor material.

16. A method comprising:
    forming Shallow Trench Isolation (STI) regions extending from a first top surface of a silicon substrate into the silicon substrate;
    etching a portion of the silicon substrate between opposite sidewalls of the STI regions to form a recess, wherein the silicon substrate comprises a second top surface in the recess;
    performing a treatment on the second top surface, wherein the treatment is performed using process gases comprising $CF_4$ and $O_2$;
    after the treatment, performing a cleaning on the second top surface of the silicon substrate;
    performing an epitaxy to grow a germanium-containing semiconductor region in the recess, wherein the germanium-containing semiconductor region is grown from the second top surface in the recess; and
    forming a Fin Field-Effect Transistor (FinFET) comprising:
       after the epitaxy, recessing the STI regions, wherein a top portion of the germanium-containing semiconductor region over the recessed STI regions forms a fin;
       forming a gate dielectric on sidewalls and a top surface of the fin; and
       forming a gate electrode over the gate dielectric.

17. The method of claim 16, wherein a flow-rate ratio of a flow rate of $O_2$ to a total flow rate of $CF_4$ and $O_2$ is greater than about 1 percent.

18. The method of claim 16, wherein the treatment comprises a plasma treatment.

19. The method of claim 16, wherein during the treatment, the silicon substrate is heated to a temperature between about 150° C. and about 300° C.

20. The method of claim 16, wherein the cleaning is performed using diluted HF solution.

* * * * *